(12) United States Patent
Chang

(10) Patent No.: US 7,864,503 B2
(45) Date of Patent: Jan. 4, 2011

(54) CAPACITIVE TYPE TOUCH PANEL

(75) Inventor: Yu-Huei Chang, Sijhih (TW)

(73) Assignee: Sense Pad Tech Co., Ltd, Apia (WS)

( * ) Notice: Subject to any disclaimer, the term of this patent is extended or adjusted under 35 U.S.C. 154(b) by 468 days.

(21) Appl. No.: 12/148,998

(22) Filed: Apr. 23, 2008

(65) Prior Publication Data

US 2008/0277259 A1 Nov. 13, 2008

(30) Foreign Application Priority Data

May 11, 2007 (TW) ............... 96116883 A

(51) Int. Cl.
*H01G 5/01* (2006.01)
*H03K 17/975* (2006.01)
(52) U.S. Cl. ............. 361/288; 361/290; 361/292; 361/283.4; 200/600; 200/269; 200/310; 345/173; 345/174; 345/175; 345/177
(58) Field of Classification Search ............. 361/288, 361/290–292, 283.1, 283.2, 283.4; 200/269, 200/310, 600; 345/173–175, 177
See application file for complete search history.

(56) References Cited

U.S. PATENT DOCUMENTS

| 4,394,643 | A | 7/1983 | Williams ............... 340/365 |
| 6,677,542 | B2 * | 1/2004 | Katakami ............... 200/5 A |
| 6,781,579 | B2 * | 8/2004 | Huang et al. ............... 345/173 |
| 6,897,390 | B2 * | 5/2005 | Caldwell et al. ............. 200/512 |
| 6,963,040 | B1 * | 11/2005 | Urman ............... 200/310 |
| 7,244,901 | B1 * | 7/2007 | Liao et al. ............... 200/600 |
| 2006/0097991 | A1 | 5/2006 | Hotelling et al. ........... 345/173 |
| 2007/0240914 | A1 | 10/2007 | Lai et al. ............... 178/18.06 |
| 2008/0122802 | A1 | 5/2008 | Furuhashi et al. ........... 345/174 |

\* cited by examiner

*Primary Examiner*—Nguyen T Ha
(74) *Attorney, Agent, or Firm*—Shirley L. Church, Esq

(57) ABSTRACT

A capacitive type touch panel includes: a transparent substrate; an array of first conductors formed on a surface of the transparent substrate; an array of second conductors formed on the surface of the transparent substrate; a plurality of conductive first bridging lines, each of which interconnects two adjacent ones of the first conductors; a plurality of conductive second bridging lines, each of which interconnects two adjacent ones of the second conductors and each of which intersects insulatively a respective one of the first bridging lines; and a plurality of spaced apart insulators, each of which is disposed at an intersection of a respective one of the first bridging lines and a respective one of the second bridging lines to separate the respective first and second bridging lines.

12 Claims, 5 Drawing Sheets

CAPACITIVE TYPE TOUCH PANEL

CROSS-REFERENCE TO RELATED APPLICATION

This application claims priority of Taiwanese Application No. 096116883, filed on May 11, 2007.

BACKGROUND OF THE INVENTION

1. Field of the Invention

This invention relates to a capacitive type touch panel, more particularly to a capacitive type touch panel including arrays of first and second electrodes formed on the same surface of a transparent substrate and disposed alternately with each other.

2. Description of the Related Art

FIG. 1 illustrates a conventional capacitive type touch panel that includes a transparent substrate 11, a first electrode unit 12 formed on a top surface of the transparent substrate 11, a second electrode unit 13 formed on a bottom surface of the transparent substrate 11, a conductive first connecting line unit 14 connected to the first electrode unit 12, a conductive second connecting line unit 15 connected to the second electrode unit 13, and conductive first and second wiring units 16, 17 connected respectively to the first and second connecting line units 14, 15. Formation of the first and second wiring units 16, 17 is conducted through wire bonding techniques. A controller (not shown) is connected to the first and second wiring units 16, 17. When the capacitive type touch panel is activated, an electric field distribution is generated between the top and bottom surfaces of the transparent substrate 11. At this time, when the user operably touches the capacitive type touch panel at one location, the electric field at the location is changed, which results in a change in the capacitance between the first and second electrode units 12, 13 at the location, thereby permitting identification of the coordinates of the location through the controller.

Since the first and second wiring units 16, 17 are formed respectively on the top and bottom surfaces of the transparent substrate 11, a gap is formed between each adjacent pair of bonding wirings of the first and second wiring units 16, 17. The gaps thus formed among the bonding wirings of the first and second wiring units 16, 17 are not fixed, which results in generation of noise between the first and second wiring units 16, 17, which, in turn, results in a difficulty in identifying the location touched by the user.

SUMMARY OF THE INVENTION

The object of the present invention is to provide a capacitive type touch panel that can overcome the aforesaid drawback associated with the prior art.

According to this invention, there is provided a capacitive type touch panel that comprises: a transparent substrate having opposite top and bottom surfaces; an array of first conductors formed on the top surface of the transparent substrate; an array of second conductors formed on the top surface of the transparent substrate and disposed alternately with the first conductors; a plurality of spaced apart conductive first bridging lines, each of which interconnects two adjacent ones of the first conductors; a plurality of spaced apart conductive second bridging lines, each of which interconnects two adjacent ones of the second conductors and each of which intersects insulatively a respective one of the first bridging lines; and a plurality of spaced apart insulators, each of which is disposed at an intersection of a respective one of the first bridging lines and a respective one of the second bridging lines so as to separate the respective one of the first bridging lines from the respective one of the second bridging lines.

BRIEF DESCRIPTION OF THE DRAWING

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 1:
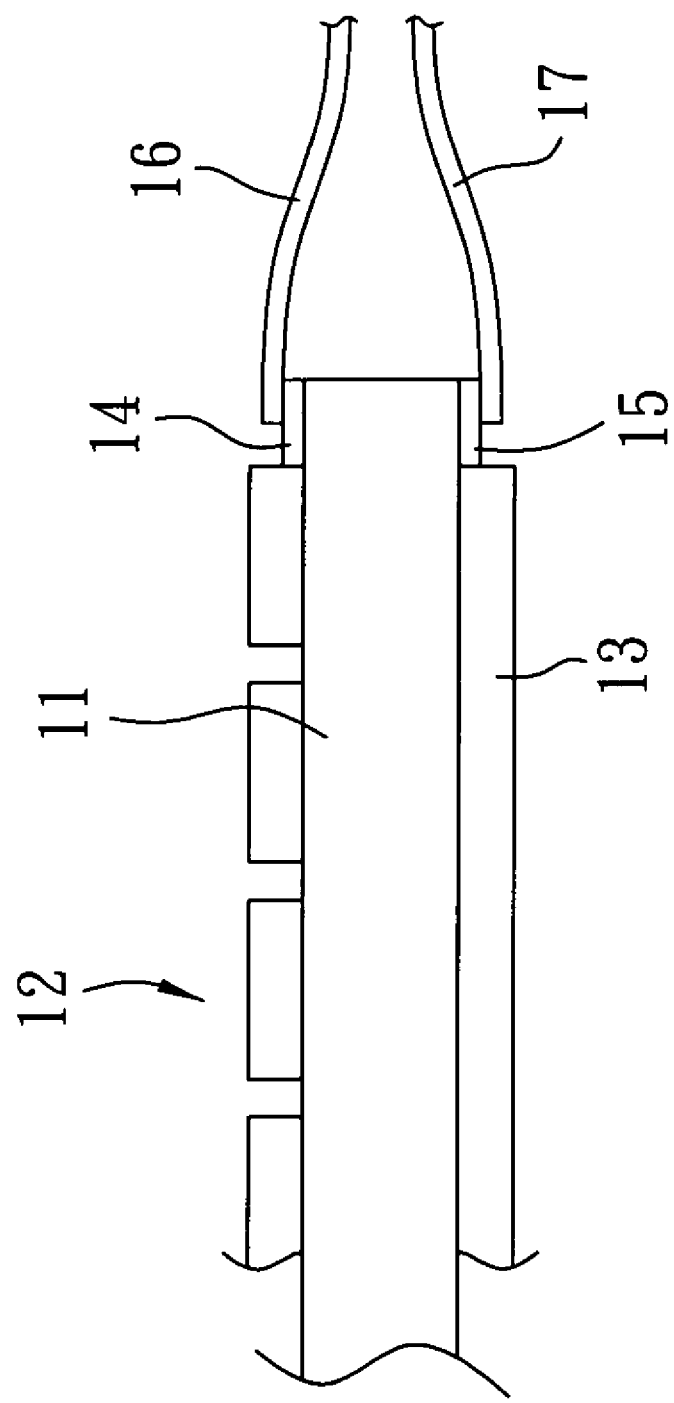
FIG. 1 is a fragmentary schematic view of a conventional capacitive type touch panel.
Figure 2:
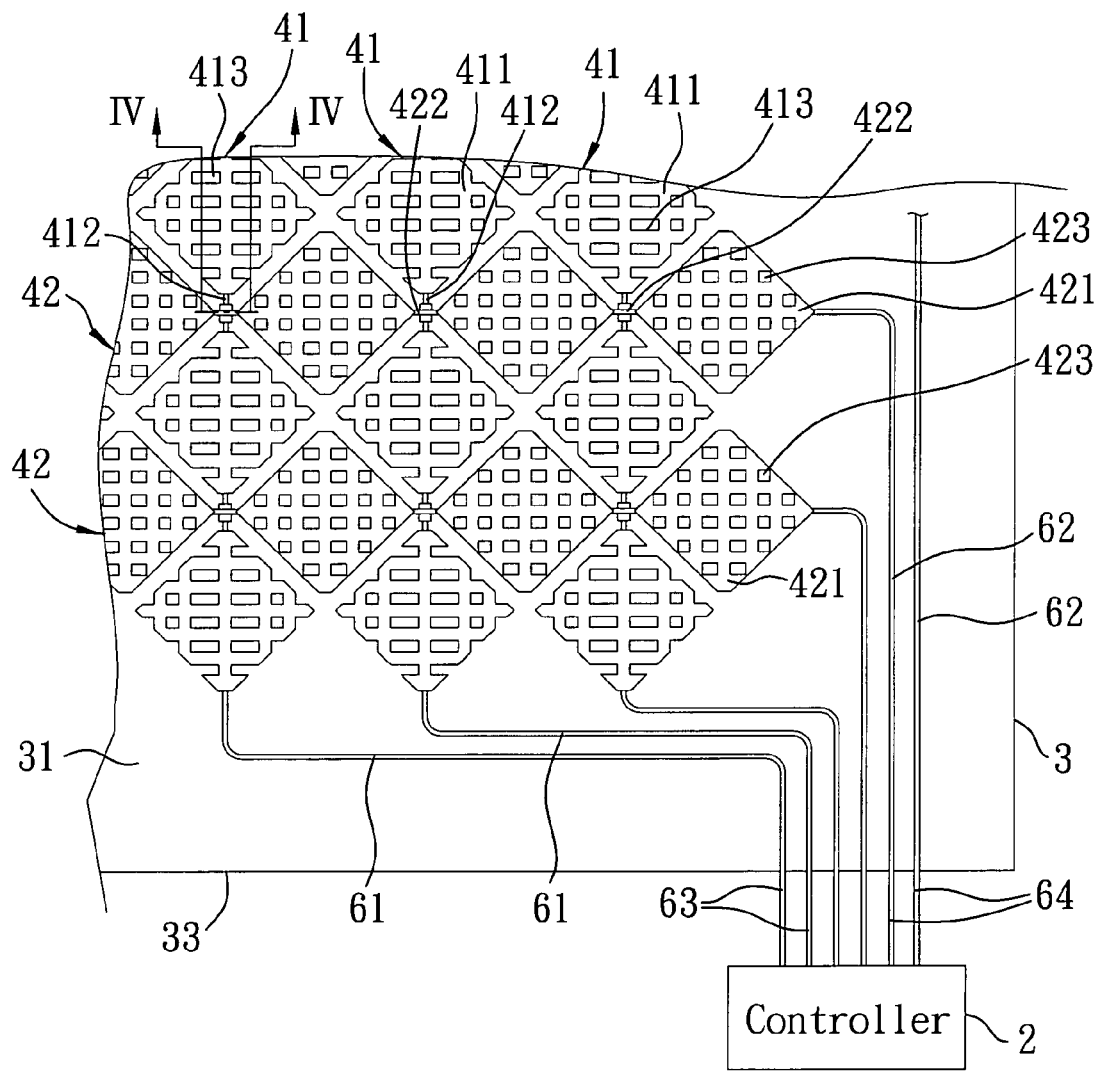
FIG. 2 is a fragmentary schematic top view of the preferred embodiment of a capacitive type touch panel according to this invention.
Figure 3:
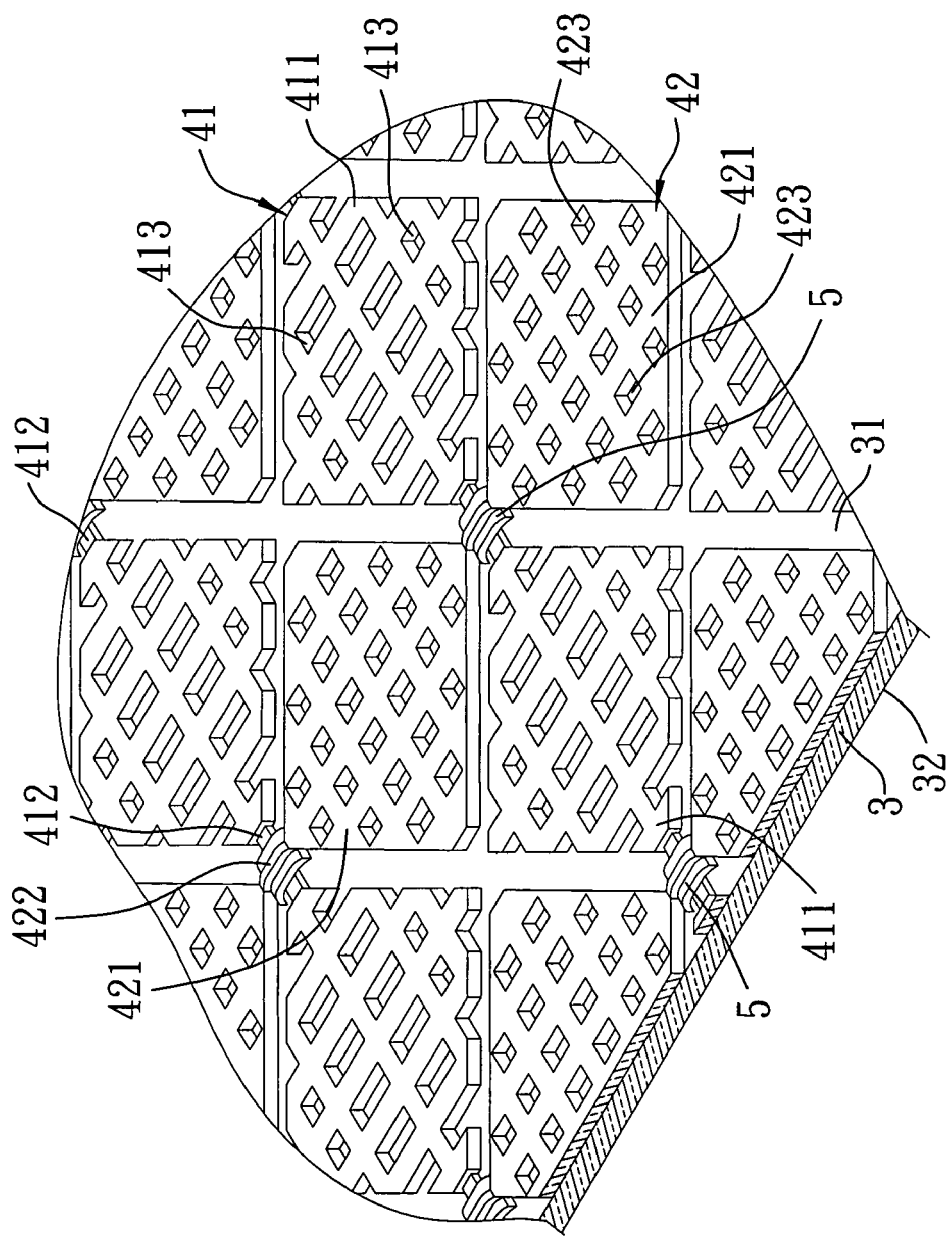
FIG. 3 is a fragmentary perspective view of the preferred embodiment.
Figure 4:
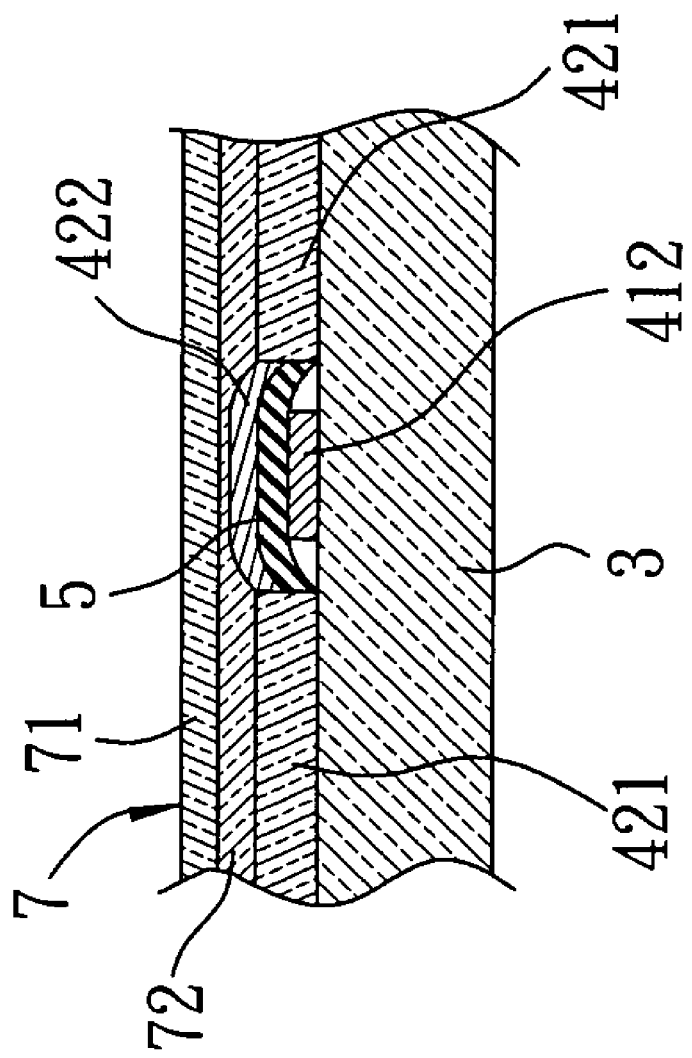
FIG. 4 is a sectional view taken along line W-W of FIG. 2.
Figure 5:
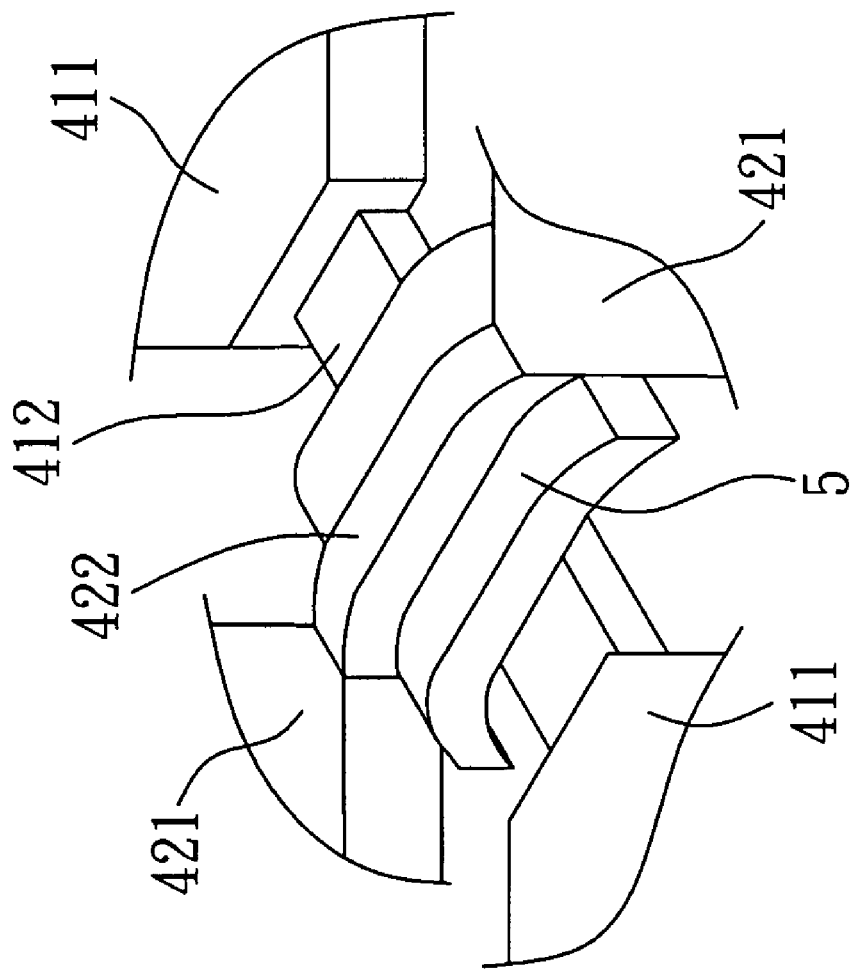
FIG. 5 is a fragmentary perspective view illustrating how a pair of first and second bridging lines of the preferred embodiment are separated from each other through an insulator.

FIGS. 2 to 5 illustrate the preferred embodiment of a capacitive type touch panel according to this invention. The capacitive type touch panel includes: a transparent substrate 3 having opposite top and bottom surfaces 31, 32; an array of first conductors 41 formed on the top surface 31 of the transparent substrate 3; an array of second conductors 42 formed on the top surface 31 of the transparent substrate 3 and disposed alternately with the first conductors 41; a plurality of spaced apart conductive first bridging lines 412, each of which interconnects two adjacent ones of the first conductors 41; a plurality of spaced apart conductive second bridging lines 422, each of which interconnects two adjacent ones of the second conductors 42 and each of which intersects insulatively a respective one of the first bridging lines 412; and a plurality of spaced apart insulators 5, each of which is disposed at an intersection of a respective one of the first bridging lines 412 and a respective one of the second bridging lines 422 and each of which is sandwiched between the respective one of the first bridging lines 412 and the respective one of the second bridging lines 422 so as to separate the respective one of the first bridging lines 412 from the respective one of the second bridging lines 422. The first and second conductors 41, 42 and the first and second bridging lines 412, 422 cooperatively form into a matrix of capacitive regions when a current is applied to first and second conductors 41, 42 and the first and second bridging lines 412, 422.

In this embodiment, each of the first and second conductors 41, 42 is made from a thin film of a conductive transparent material that is preferably selected from the group consisting of indium-tin-oxide, indium-zinc-oxide, zinc oxide, aluminum zinc oxide, and combinations thereof.

Preferably, the thin film of each of the first and second conductors 41, 42 is formed with a plurality of holes 413, 423, and more preferably, each of the holes 413, 423 is a through-hole. Since the area of each of the first and second conductors 41, 42 is a key parameter to the capacitance, sensitivity in detecting the coordinates of a touched location by the user can be adjusted through changing of the number and/or the diameter of the holes 413, 423.

The holes 413, 423 in the thin film of each of the first and second conductors 41, 42 occupy a total hole area within an area enclosed by a periphery of the thin film of the respective one of the first and second conductors 41, 42. In this preferred embodiment, the thin film of each of the first and second conductors 41, 42 has a solid area 411, 421 not equal to the total hole area of the holes 413, 423 therein, and the solid area of the thin film of each of the first conductors 41 differs from that of the thin film of each of the second conductors 42. Alternatively, the shape and the solid area of the thin film of each of the first conductors 41 are the same as those of the thin film of each of the second conductors 42.

Preferably, the transparent substrate 3 is made from a material selected from the group consisting of glass, polymethylmethacrylate, polyvinylchloride, polypropylene, polyethylene terephthalate, polyethylene naphthalate, and polycarbonate.

Preferably, each of the insulators 5 is made from a material selected from the group consisting of photoresist, silicon dioxide, titanium dioxide, zinc oxide, silicon nitride, aluminum nitride, and tantalum oxide.

The capacitive type touch panel further includes a plurality of conductive first connecting lines 61 formed on the top surface 31 of the transparent substrate 3, and a plurality of conductive second connecting lines 62 formed on the top surface 31 of the transparent substrate 3. The first conductors 41 are arranged into parallel columns. The first conductors 41 of each of the columns are interconnected by respective ones of the first bridging lines 412. The second conductors 42 are arranged into parallel rows. The second conductors 42 of each of the rows are interconnected by respective ones of the second bridging lines 422. Each of the first connecting lines 61 is connected to an endmost one of the first conductors 41 of a respective one of the columns of the first conductors 41. Each of the second connecting lines 62 is connected to an endmost one of the second conductors 42 of a respective one of the rows of the second conductors 42.

The capacitive type touch panel further includes a plurality of first bonding wires 63 and a plurality of second bonding wires 64. Each of the first bonding wires 63 is connected to a respective one of the first connecting lines 61, and extends outwardly therefrom through a side edge 33 of the transparent substrate 3. Each of the second bonding wires 64 is connected to a respective one of the second connecting lines 62, and extends outwardly therefrom through the side edge 33 of the transparent substrate 3. The first and second bonding wires 63, 64 are normally formed on a flexible board. A controller 2 is connected to the first and second bonding wires 63, 64 for detecting the location where a change in the electric field among the first and second conductors 41, 42 occurs during the use of the capacitive type touch panel.

A protective layer 7 is formed on the first and second conductors 41, 42 and the top surface 31 of the transparent substrate 3, and includes a wear-resistant layer 71 and an anti-reflective layer 72.

By forming the first and second conductors 41, 42 on the same surface of the transparent substrate 3, the aforesaid problem of identifying the touched location attributed to the gap between the first and second bonding wires as encountered in the prior art can be eliminated.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A capacitive type touch panel comprising:
    a transparent substrate having opposite top and bottom surfaces;
    an array of first conductors formed on said top surface of said transparent substrate;
    an array of second conductors formed on said top surface of said transparent substrate and disposed alternately with said first conductors;
    a plurality of spaced apart conductive first bridging lines, each of which interconnects two adjacent ones of said first conductors;
    a plurality of spaced apart conductive second bridging lines, each of which interconnects two adjacent ones of said second conductors and each of which intersects insulatively a respective one of said first bridging lines; and
    a plurality of spaced apart insulators, each of which is disposed at an intersection of a respective one of said first bridging lines and a respective one of said second bridging lines so as to separate the respective one of said first bridging lines from the respective one of said second bridging lines.

2. The capacitive type touch panel of claim 1, wherein each of said insulators is sandwiched between the respective one of said first bridging lines and the respective one of said second bridging lines.

3. The capacitive type touch panel of claim 1, wherein each of said first and second conductors is made from a thin film of a conductive transparent material.

4. The capacitive type touch panel of claim 3, wherein said conductive transparent material is selected from the group consisting of indium-tin-oxide, indium-zinc-oxide, zinc oxide, aluminum zinc oxide, and combinations thereof.

5. The capacitive type touch panel of claim 3, wherein said thin film of each of said first and second conductors is formed with a plurality of holes.

6. The capacitive type touch panel of claim 5, wherein each of said holes is a through-hole.

7. The capacitive type touch panel of claim 5, wherein said holes in said thin film of each of said first and second conductors occupy a total hole area within an area enclosed by a periphery of said thin film of the respective one of said first and second conductors, said thin film of each of said first and second conductors having a solid area not equal to said total hole area of said holes therein.

8. The capacitive type touch panel of claim 7, wherein said solid area of said thin film of each of said first conductors differs from that of said thin film of each of said second conductors.

9. The capacitive type touch panel of claim 1, wherein said transparent substrate is made from a material selected from the group consisting of glass, polymethylmethacrylate, polyvinylchloride, polypropylene, polyethylene terephthalate, polyethylene naphthalate, and polycarbonate.

10. The capacitive type touch panel of claim 1, wherein each of said insulators is made from a material selected from the group consisting of photoresist, silicon dioxide, titanium dioxide, zinc oxide, silicon nitride, aluminum nitride, and tantalum oxide.

11. The capacitive type touch panel of claim 1, further comprising a plurality of conductive first connecting lines formed on said top surface of said transparent substrate, and a plurality of conductive second connecting lines formed on said top surface of said transparent substrate, said first conductors being arranged into parallel columns, said first conductors of each of said columns being interconnected by respective ones of said first bridging lines, said second conductors being arranged into parallel rows, said second conductors of each of said rows being interconnected by respective ones of said second bridging lines, each of said first connecting lines being connected to an endmost one of said first conductors of a respective one of said columns of said first conductors, each of said second connecting lines being connected to an endmost one of said second conductors of a respective one of said rows of said second conductors.

12. The capacitive type touch panel of claim 11, further comprising a plurality of first bonding wires and a plurality of second bonding wires, said transparent substrate further having a side edge, each of said first bonding wires being connected to a respective one of said first connecting lines and extending outwardly therefrom through said side edge of said transparent substrate, each of said second bonding wires being connected to a respective one of said second connecting lines and extending outwardly therefrom through said side edge of said transparent substrate.

* * * * *